United States Patent [19]

Viles et al.

[11] Patent Number: 4,935,071
[45] Date of Patent: Jun. 19, 1990

[54] BAKING OF LITHOGRAPHIC PLATES

[75] Inventors: Nicholas J. Viles, Harrogate; Brian Cokill, Leeds, both of England

[73] Assignee: Horsell Engineering Limited, Leeds, England

[21] Appl. No.: 190,015

[22] Filed: May 4, 1988

[30] Foreign Application Priority Data

May 7, 1987 [GB] United Kingdom ............... 8710821

[51] Int. Cl.⁵ .............................................. C21D 9/54
[52] U.S. Cl. ...................................... 148/156; 266/103
[58] Field of Search ............... 198/156; 266/103, 102, 266/110, 104; 148/155

[56] References Cited

U.S. PATENT DOCUMENTS

| 2,189,836 | 2/1940 | Schon | 148/156 |
| 2,345,181 | 3/1944 | Cooper et al. | 266/103 |
| 2,448,835 | 9/1948 | Schefe | 266/103 |
| 2,652,478 | 9/1953 | Howard | 266/103 |
| 2,730,348 | 1/1956 | Rendel | 266/103 |
| 3,649,381 | 3/1972 | Mayhew | 148/156 |
| 4,385,945 | 5/1983 | Compton et al. | 148/156 |

Primary Examiner—Scott Kastler
Attorney, Agent, or Firm—Klauber & Jackson

[57] ABSTRACT

The tendency of lithographic plates to buckle during baking under top heat with the result that the heat treatment is not uniform to minimised by passing the plates through an oven on a conveyor belt which inclines upwardly over part of its path and then downwardly, so that the plates are caused to bend transversely and the bends are caused to travel lengthwise of the plates.

10 Claims, 3 Drawing Sheets

BAKING OF LITHOGRAPHIC PLATES

The invention relates to a method of and apparatus for the heat-treatment of thin sheets of material, such as lithographic printing plates.

It is a matter of common experience that when lithographic plates are passed through a baking oven under a bank of hot-air jets the plates have a tendency to buckle whereby a transverse section, away from the leading and trailing edges, has an undulating shape rather than, as before heating, a flat form. The deformation, which is permanent, results in some areas lifting closer to the heat source and being excessively heated relative to other areas, to the detriment of the performance of the plates.

In order to overcome the above-mentioned problem we provide, in accordance with one aspect of the invention, a method of heat-treating a thin sheet of material comprising creating a temporary bend across the sheet and applying heat to the sheet at least in the vicinity of the bend. Preferably the radius of curvature of the sheet at each side of the bend is greater than that of the bend itself, and indeed may be infinite.

Preferably the bend moves along the sheet, and the motion may be in a direction at right angles to the bend.

Preferably the sheet is moved relative to the source of the heat and the movement may correspond with one or both of the rate and direction of motion of the bend.

According to a further aspect of the invention we provide a method of heat-treating a thin sheet of material comprising advancing leading and trailing portions of the sheet along respective paths at an angle to one another, and applying heat to the sheet at least where the paths converge.

Preferably more heat is applied to the sheet in the region of the bend or where the paths converge than elsewhere.

According to yet another aspect of the invention, we provide apparatus for the heat-treatment of a thin sheet of material comprising means for creating a temporary bend across the sheet and means for applying heat to the sheet at least in the vicinity of the bend.

Preferably means are provided for advancing the bend along the sheet at right angles to the bend.

Preferably means are also provided for moving the sheet relative to the source of the heat, and the movement may correspond with one or both of the rate and direction of advancement of the bend.

According to still another aspect of the invention, we provide apparatus for the heat-treatment of thin sheets of material comprising means for advancing leading and trailing portions of the sheet along respective paths at an angle to one another, and means for applying heat to the sheet at least where the paths converge.

Preferably the said paths are defined by conveyor means. Each of the conveyor means may incline towards the heating means, and the heating means may be adapted to apply more heat to the sheet where the paths converge than elsewhere.

Embodiments of the invention will now be describe of example and with reference to the accompanying drawings of which:

Figure 1:
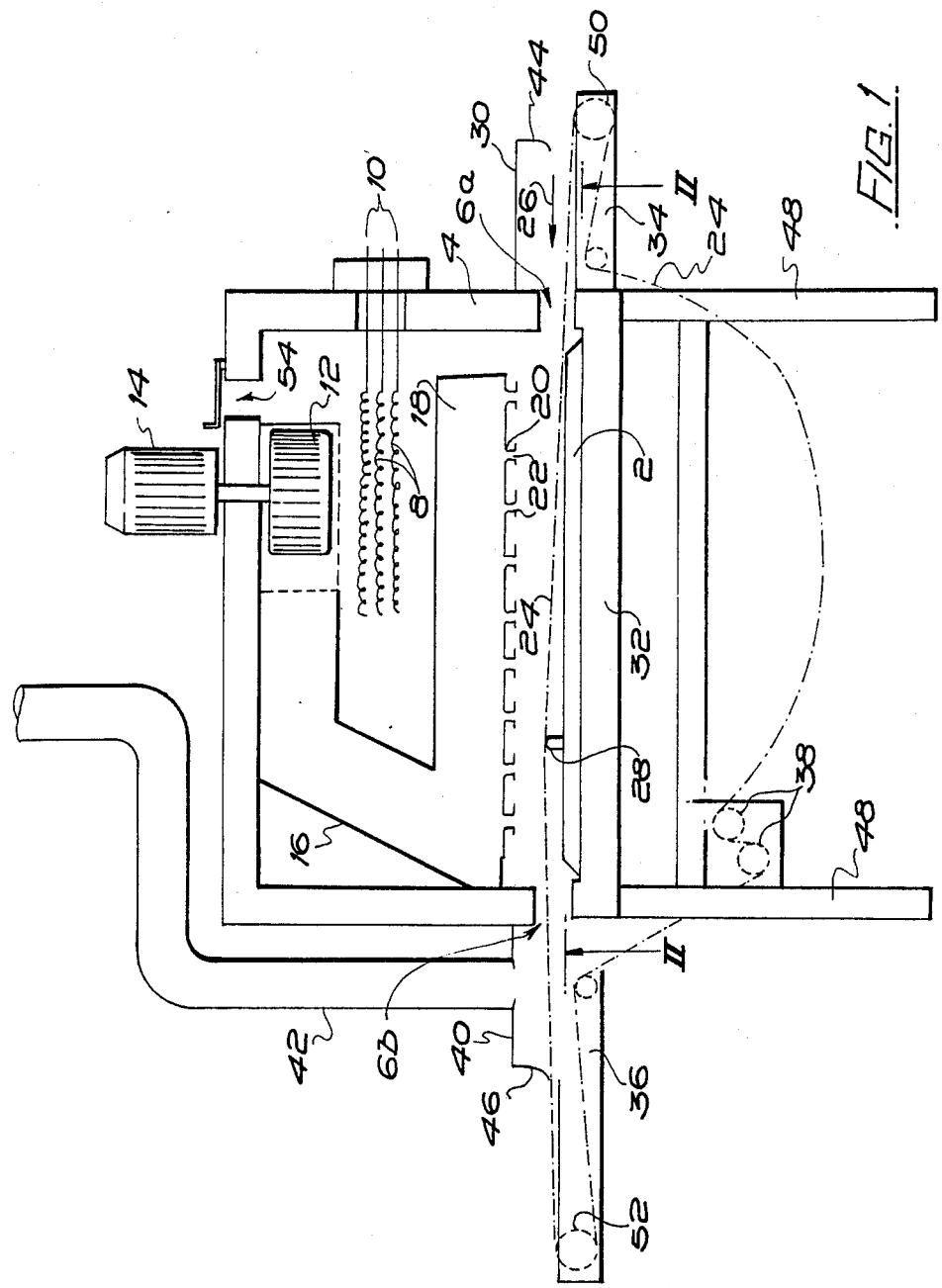
FIG. 1 is a schematic side elevation of a baking oven.

As shown in FIG. 1, the baking oven comprises a solid bed plate 2, carried by a heat-insulating base 32 supported on legs 48. The base 32 is covered by a heat-insulating housing 4, leaving narrow gaps 6a, 6b therebetween for the passage of lithographic printing plates. The housing has a valved air outlet 54. Exteriorly of the gaps 6a, 6b, the base 32 has extensions 34 and 36 respectively for the introduction and removal of plates.

Figure 2:
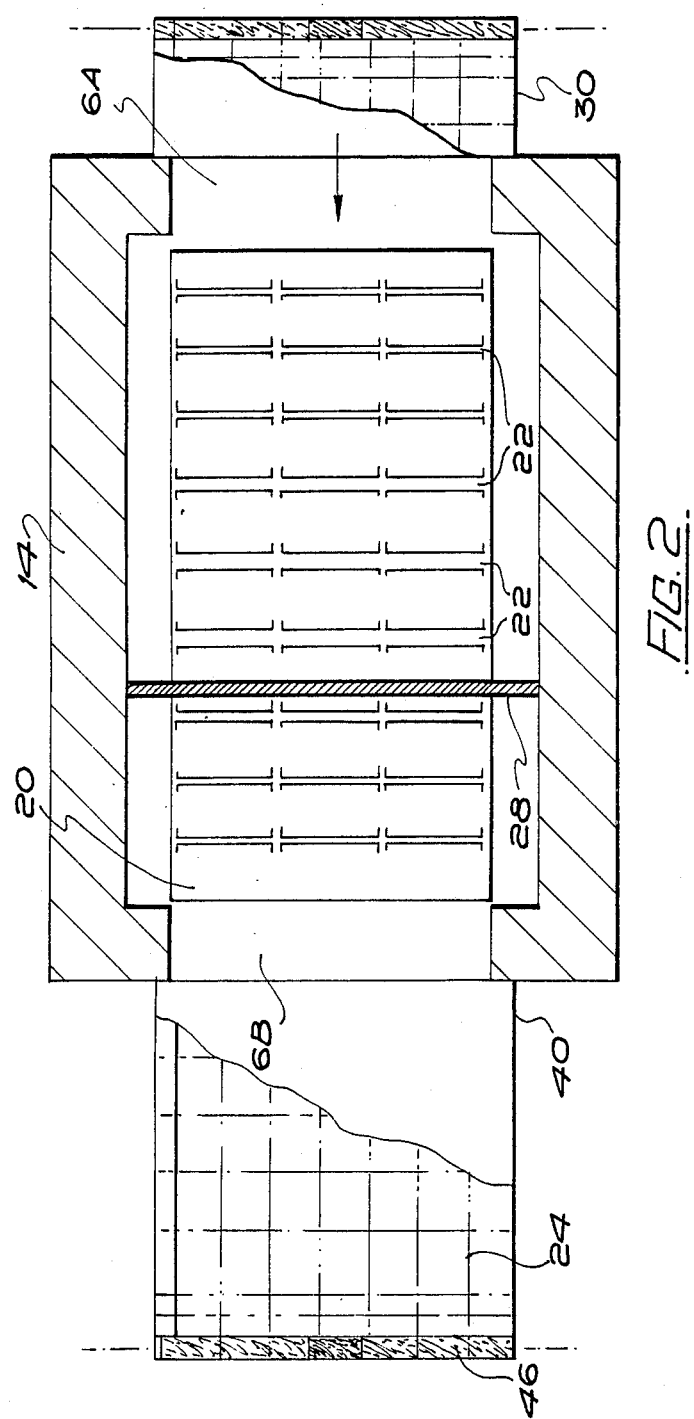
FIG. 2 is an underneath plan view on lines II—II of FIG. 1.

The housing 4 encloses electrical heating elements 8 having terminals 10 outside the housing for connection to a source of electrical power. A blower fan 12, operated by a motor 14, draws air, heated by the elements 8, into a duct 16 which leads to a plenum chamber 18. The lower, essentially horizontal face 20 of the chamber 18 is provided with a plurality of louvre outlets 22 for the downward discharge of the heated air. The outlets 22 are elongate transversely of the oven, that is to say perpendicularly to FIG. 1, and are arranged three lateral rows of nine outlets spaced apart lengthwise of the oven as shown in FIG. 2 so that the heated air is directed towards the bed plate 2 over substantially the whole area thereof. In other embodiments, not shown, a different arrangement of openings may be adopted. In order to control the heat regime applied to plates being carried over the bed-plate 2, each outlet is individually adjustable in width so that more hot air may be passed through certain of the outlets, relative to the others, as experience shows to be beneficial.

A flexible conveyor comprising a longitudinally-tensioned endless reticulated conveyor belt 24, is arranged to be driven by rollers 38 over rollers 50, 52 supported by the base extensions 34 and 36, and the bed plate 2, in the direction of arrow 26. Lithographic printing plates, resting on the conveyor, are carried thereby over the bed 2, passing into and out of the housing 4 respectively through the gaps 6a, 6b.

As the conveyor 24 passes through the gaps 6a and 6b it is arranged close to the bed 2, of which the upper surface is arranged to be substantially horizontal, but intermediate the gaps, and nearer the exit gap 6b than the entry gap 6a, the conveyor is arranged to pass over a stainless steel bar 28, which is arranged on and transversely of the bed 2. The bar 28 thus lifts the conveyor 24 intermediate the gaps 6a, 6b, so that the portion of the conveyor upstream of the bar inclines slightly upwardly in its direction of movement, whilst the portion downstream of the bar is inclined slightly downwardly. Inasmuch as the weight and tension of the conveyor are both finite, the paths of the portions upstream and downstream of the bar will be slightly curved in catenary-fashion. In the present embodiment, the bar 28 is twice as far from gap 6a as it is from gap 6b, and is about 25 mm above the level of the bed 2, but the distances and dimensions may be varied in other embodiments as experience dictates.

The majority of lithographic printing plates are very thin compared with their superficial dimensions, a fact which allows the distortion which the invention is designed to overcome. By virtue of the same thinness, it is found that a plate being carried through the oven on the conveyor 24 will bend transversely intermediate its leading and trailing edges, and indeed in the vicinity of the bar 28, so that the portions of plate immediately adjacent those edges conform to the respectively inclined paths of the conveyors.

By virtue of the inclination of the conveyor 24, the plates carried thereon are brought closer to the plenum chamber 18 in the vicinity of the bar 28 than elsewhere thus increasing the potential for heating the plates as they bend over the bar 28. Moreover, the outlets 22 are adjusted in width so that according to requirements the outlets closest to the bar 28 are widened relative to the other outlets so that more hot air is directed onto the portion of the plate passing, at any one time, over the bar, thus further increasing the concentration of the heat in the region of the bend in the plates.

Ideally, however, heat will not be provided exclusively in the region of the bend, but will be applied to each individual plate gradually and progressively from the entry into the oven as defined by the housing 4 through the gap 6a as far as the bar 28, whilst from the bar to the exit gap 6b the heating of the plate will diminish. The oven includes a pre-heating unit 30 to effect an even more gentle initial warm-up of the plates than can be provided by the hot-air jets 22. The unit 30 comprises essentially an enclosure attached to the outside of the housing 4 so as to receive hot air from the interior of the housing via the gap 6a, and to allow passage of the plates, carried on the conveyor chains, thereunder. The entrance of the unit 30 is protected by a curtain 44.

Exterior of the gap 6b is an exhaust shroud 40 connecting to an exhaust pipe 42 which leads to an exhaust fan, not shown, for the removal of any noxious fumes which may be generated by the heating of the plates. The plate exit from the shroud 40 is protected by a curtain 46.

In use of the apparatus described, a printing plate is placed on the conveyor 24 as it overlies the base extension 34, and is carried thereupon at speeds which may be in the range 20-100 ins/min into the interior of the housing 4. As the plate first enters the pre-heat unit 30 via the curtain 44, it is warmed by the hot air contained therein. Once inside the housing 4 it is subjected to streams of hot air emanating from successive ones of the outlets 22. The plate may be of significant length relative to the length of the oven, in the direction of movement of the conveyor, and indeed may be as long as or even longer than the oven. In any event it is well within the bounds of possibility that the leading edge of a plate will be receiving heat from the hot-air outlets, whilst the mid-portion of the plate is being merely warmed-up in the pre-heat unit 30 and the trailing portion still overlies the extension 34 and remains at its original temperature unless somewhat warmed by conduction of heat from the leading portion.

As the leading portion of the plate advances, supported on the conveyor 24, the increasing heat may tend to cause the plate to buckle, wave-like, across its width and at a distance from the leading edge itself, especially if it is particularly wide and thin, although the gradualness of the increase of temperature and the slight upward curvature of the plates dictated by the catenary form of the conveyor serve to reduce this tendency. As the leading edge passes over the bar 28, where the supporting conveyor begins to incline slightly downwardly, the plate, possessing a certain rigidity, retains for a time the upward curvature of the first portion of the conveyor, so that the leading edge lifts off the conveyor and approaches still further towards the hot-air outlets downstream of the bar 28. However, after a further advance, of length dependent on the rigidity of the plate, the weight of the unsupported leading portion causes the plate to bend transversely in the vicinity of the bar 28 so that the leading portion of the plate drops onto the downwardly inclined conveyor and conforms at least substantially to the inclination thereof.

As the plate advances with the conveyor, the position of the bend, relative to the oven, remains substantially stationary whilst, relative to the plate itself, it moves towards the trailing edge. When the trailing edge, having been gradually heated by the pre-heat unit and the first of the hot-air outlets as was the leading edge, approaches the bar 28 it remains in contact with the chains until the elasticity of the material of the plate in the region of the bend overcomes the weight of the diminishing trailing portion and lifts that portion off the conveyor so that it conforms generally to the curvature of the forward part of the plate so that the bend ceases to exist. By this time, unless the plate is unusually short, the leading edge will have passed out of the housing through the exit gap 6b, shroud 40 and on to the removal platform 36. Thereafter, the trailing portion will be subjected to further although, by virtue of diminishing width of the remaining air outlets, diminishing heat regime and will itself leave the oven.

For reasons which are not entirely clear, the leading and trailing edges of the plates are not very susceptible to buckling. By arranging for the plate to be temporarily bent across its width, progressively along its length from near the leading edge to near the trailing edge, and because it is extremely difficult to bend a sheet in mutually transverse directions at the same time, the temporary bending brought about by the angled conveyor effectively eliminates the unwanted buckling at least in the vicinity of the bar 28.

Both the unwanted buckling and the bending which replaces it bring parts of the plate closer to the heat source than other parts, but the latter deformation is unobjectionable because unlike the former it is impermanent and progresses, with the advance of the plate, over at least the greater part of the plate. Moreover, both the leading and trailing edges, which are not subject to the temporary bend, are in turn lifted as indicated above towards the heat source, so that virtually each portion of the plate in turn reaches a point of maximum heat input.

There may be, in particularly adverse circumstances, some slight transverse buckling between the bend and the leading or, more likely, between the bend and the trailing edge, causing uneven heating, and this buckling may be permanent. However, by concentrating the heat input largely where it can be assured that the treatment is even across the width of the plate, any unevenness of treatment is rendered less significant.

Figure 3:
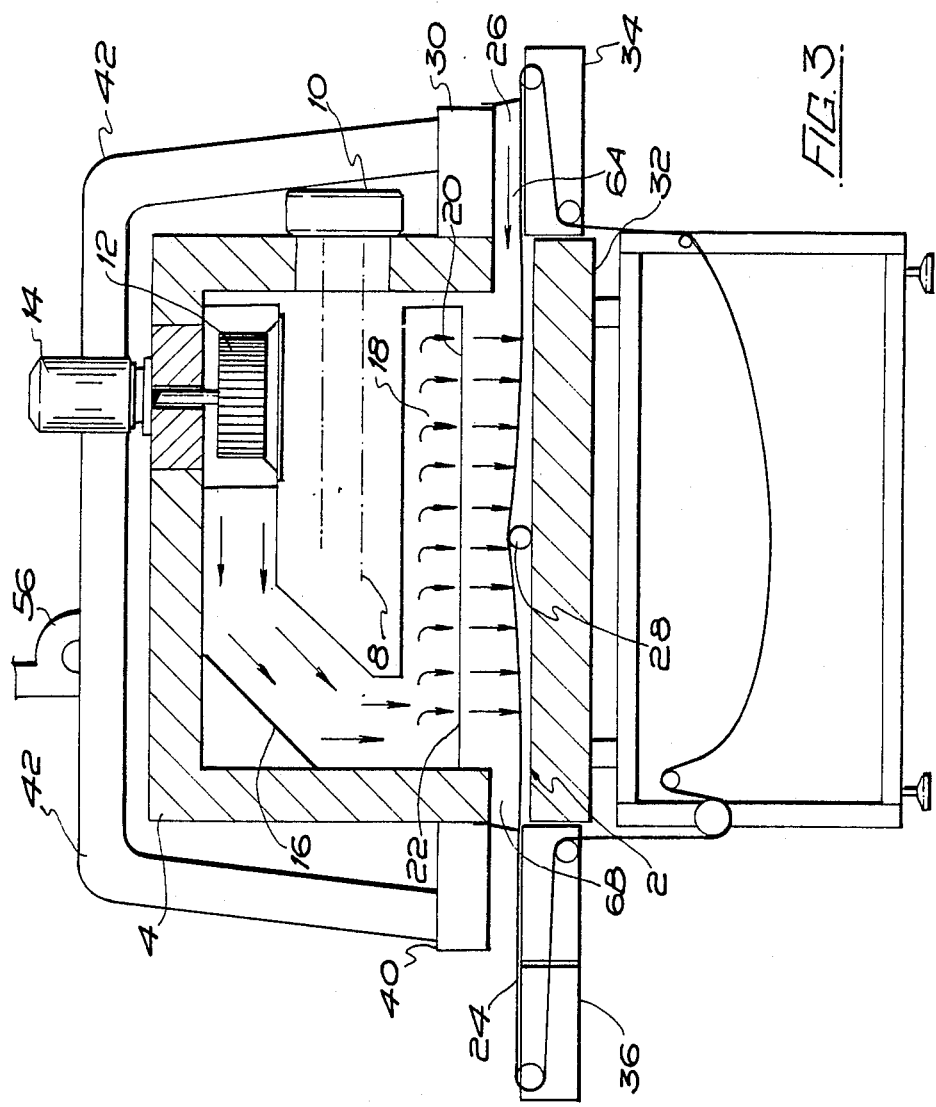
FIG. 3 is a side elevation of an oven in a second embodiment.

In the embodiment shown in FIG. 3, features similar to those of FIG. 1 are given like reference numbers. The deviating bar 28 is of circular section for this has been found to be quite effective, whether the bar is solid or hollow, and is shown mid-way between the gaps 6a and 6B. The exhaust pipe 42 connects to both exhaust shroud 40 and the pre-heat unit 30, and is provided with an exhaust fan 56. The machine is provided with a protective cover (not shown).

Experiments have been conducted to compare the effect of the deviation in the path of the conveyor through the oven. Lithographic plates of different sizes were passed through an oven according to the invention at different speeds and temperatures, and a further set of plates was passed through the same oven under similar conditions but with the bar 28 removed. The proportion of each plate regarded as inadequately baked, by virtue of its light-sensitive coating's being removable with deletion gel, was assessed, and the permanent distortion attributable to heat-induced buckling was measured. The results shown in the Tables below indicate that without the angled conveyor (Table A) and particularly at the high temperature necessitated by high speed of passage through the oven, there were severe distortion and uneven baking, but both defects were substantially eliminated by use of the invention (Table B). (Note that in the Tables experimental error in the calculation of % suitable bake is ±5% and in measurement of distortion ±1 mm.)

TABLE A

| Plate size (mm) | Speed ins/min | Temp. C | % area suitably baked | Distortion (mm) |
|---|---|---|---|---|
| 810 × 1030 × 0.3 | 20 | 270 | 62 | 5 |
| " | 40 | 285 | 57 | 6 |
| " | 70 | 315 | 50 | 8 |
| 810 × 1030 × 0.5 | 20 | 275 | 65 | 4 |
| " | 40 | 290 | 58 | 4 |
| " | 70 | 320 | 52 | 5 |
| 1145 × 1400 × 0.3 | 20 | 275 | 39 | 8 |
| " | 40 | 295 | 33 | 8 |
| " | 70 | 310 | 27 | 10 |
| 1145 × 1400 × 0.5 | 20 | 280 | 51 | 5 |
| " | 40 | 300 | 43 | 5 |
| " | 70 | 320 | 40 | 6 |
| 1500 × 1900 × 0.5 | 20 | 305 | 28 | 10 |
| " | 40 | 315 | 25 | 15 |
| " | 70 | 325 | 20 | 20 |

TABLE B

| Plate size (mm) | Speed ins/min | Temp. C | % area suitably baked | Distortion (mm) |
|---|---|---|---|---|
| 810 × 1030 × 0.3 | 20 | 270 | 100 | 0 |
| " | 40 | 285 | 100 | 0 |
| " | 70 | 305 | 98 | 1 |
| 810 × 1030 × 0.5 | 20 | 275 | 100 | 0 |
| " | 40 | 300 | 100 | 0 |
| " | 70 | 310 | 98 | 2 |
| 1145 × 1400 × 0.3 | 20 | 275 | 100 | 0 |
| " | 40 | 302 | 100 | 0 |
| " | 70 | 312 | 98 | 2 |
| 1145 × 1400 × 0.5 | 20 | 280 | 100 | 0 |
| " | 40 | 300 | 100 | 0 |
| " | 70 | 320 | 98 | 2 |
| 1500 × 1900 × 0.5 | 20 | 305 | 98 | 0 |
| " | 40 | 315 | 96 | 2 |

We claim:

1. A method of heating a thin sheet of material of finite length having leading and trailing free end, which is required to be heated to a predetermined extent, comprising the steps of:
    (a) supporting the sheet of material on a surface such that said support occurs only by reason of said surface,
    (b) causing said sheet supported on said surface to move in a substantially horizontal direction past a means which applies heat.
    (c) applying heat to the sheet to said predetermined extent, and
    (d) at least substantially reducing distortion in the sheet due to the heating by causing said leading and trailing ends successively to pass over a means to cause the sheet to bend, thereby causing the sheet to bend substantially under gravity in a controlled manner.

2. A method according to claim 1, wherein said step of applying heat includes the step of applying heat to the sheet remote from said bend and in lesser amounts than at said bend.

3. A method according to claim 1, wherein said means to cause the sheet to bend forms an elongated member lying transverse to the direction of movement of the sheet, and said step of at least substantially reducing distortion includes the step of causing the sheet to travel over said member in its movement so that in effect the bend in the sheet travels along the sheet as the sheet moves in the horizontal direction.

4. A method according to claim 3, wherein said step of causing the sheet to move includes the step of providing a conveyor on which the sheet is supported as it is moved past said heating means, and said step of at least substantially reducing distortion includes the step of causing said conveyor to travel over said elongated member.

5. A method according to claim 1, wherein said sheet is a lithography printing plate.

6. Apparatus for heating a thin sheet of material of finite length having leading and trailing free and, to a predetermined extent, comprising:
    (a) an endless conveyor for supporting the sheet on a surface thereof such that said support occurs only by reason of said surface and is arranged for substantially horizontal movement thereon,
    (b) heating means arranged to heat the sheet to said predetermined extent, and
    (c) bending means for causing the sheet to bend substantially under gravity and in a controlled manner, said bending means being arranged such that the conveyor travels over said bending means during said substantially horizontal movement.

7. Apparatus according to claim 6, wherein said heating means comprises a plenum chamber, electric heating coils in said chamber, air movement means for moving air over said heating coils and into the plenum chamber, and hot air outlets located above said conveyor.

8. Apparatus according to claim 7, wherein the air outlets adjacent the bending means are greater in size than the air outlets remote from said bending means so that more heat applied to the sheet at said bending means than elsewhere.

9. Apparatus according to claim 6, wherein said bending means comprises an elongate member lying transverse to the direction of movement of the conveyor.

10. Apparatus according to claim 6, wherein the conveyor is built up from chains.

* * * * *